United States Patent [19]

Kasahara et al.

[11] Patent Number: 4,864,168
[45] Date of Patent: Sep. 5, 1989

[54] PROCESS FOR CONTROLLING AN OPTICAL PNPN THYRISTOR TO BE DRIVEN

[75] Inventors: Kenichi Kasahara; Yoshiharu Tashiro, both of Tokyo, Japan

[73] Assignee: NEC Corporation, Tokyo, Japan

[21] Appl. No.: 223,600

[22] Filed: Jul. 25, 1988

[30] Foreign Application Priority Data

Jul. 27, 1987 [JP] Japan ................... 62-188189

[51] Int. Cl.$^4$ ............... H03K 17/72; H03K 17/78
[52] U.S. Cl. .................... 307/631; 307/311; 357/19; 357/30; 365/114; 365/180
[58] Field of Search ............ 307/631, 311, 637; 357/17, 19, 300; 365/110, 111, 112, 114, 154, 180, 181, 227, 229

[56] References Cited

U.S. PATENT DOCUMENTS

| 3,852,797 | 12/1974 | Lebailly et al. | 357/19 |
| 3,852,798 | 12/1974 | Lebailly et al. | 357/19 |
| 3,979,587 | 9/1976 | de Cremoux | 357/19 |
| 4,806,997 | 2/1989 | Simmons et al. | 357/17 |

OTHER PUBLICATIONS

Taylor et al., "A New Double Heterostructure Optoelectronic . . . Epitaxy", J. Appl. Phys. 59 (2), 15 Jan. 1986, pp. 596–600.

Primary Examiner—John Zazworsky
Attorney, Agent, or Firm—Sughrue, Mion, Zinn, Macpeak & Seas

[57] ABSTRACT

A process for controlling an optical pnpn thyristor to be driven comprises a step of applying a train of pulses to maintain a low impedance state of an optical pnpn thyristor which is shifted beforehand to be in the low impedance state by a positive set pulse. Each of the train of pulses is less than in its level than the positive set pulse. When light emission is required for the reading of an information, a positive set pulse is applied to the optical pnpn thyristor. As a result, electric power consumption is reduced during a time storing the information.

2 Claims, 6 Drawing Sheets

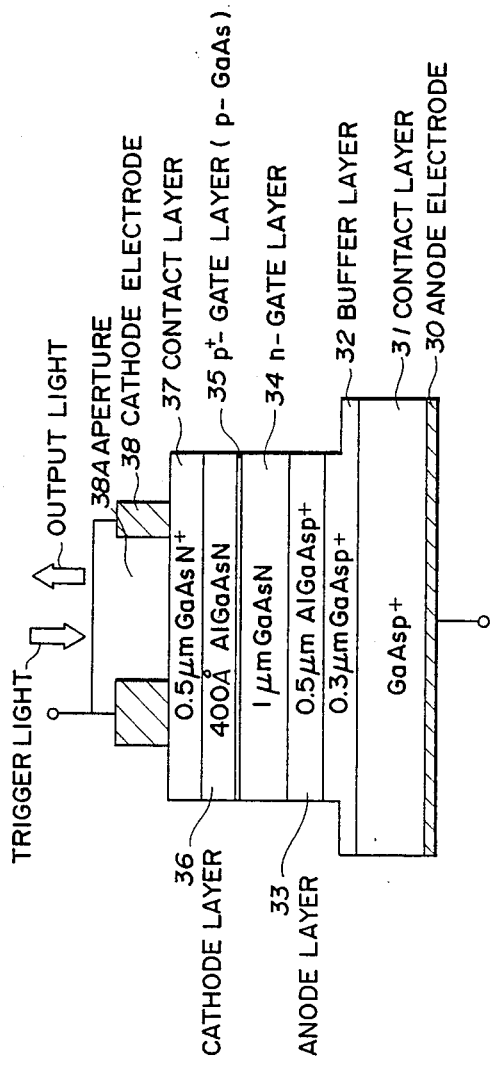
FIG. IA PRIOR ART
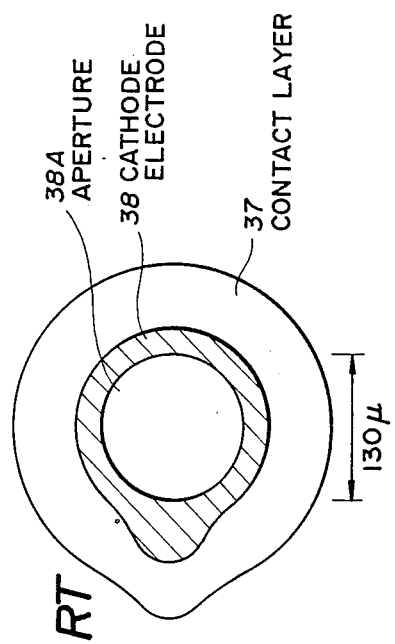
FIG. IB PRIOR ART (I) HIGH IMPEDANCE STATE (OFF)
(II) LOW IMPEDANCE STATE (ON)

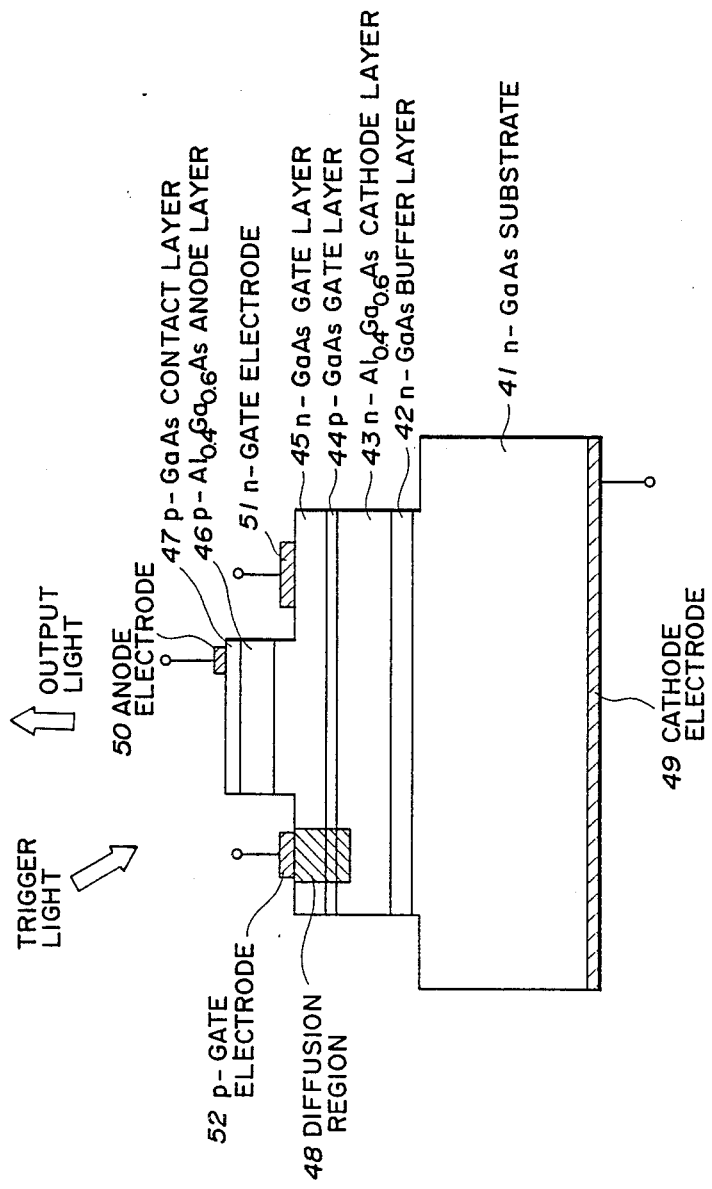

ZERO VOLTAGE BIAS

HIGH INPEDANCE (OFF STATE)

LOW INPEDANCE (ON STATE)

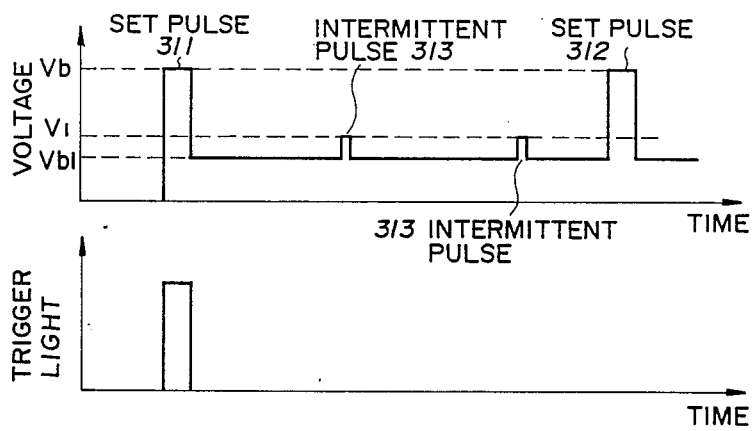
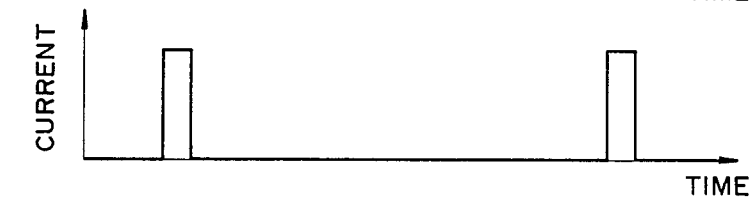
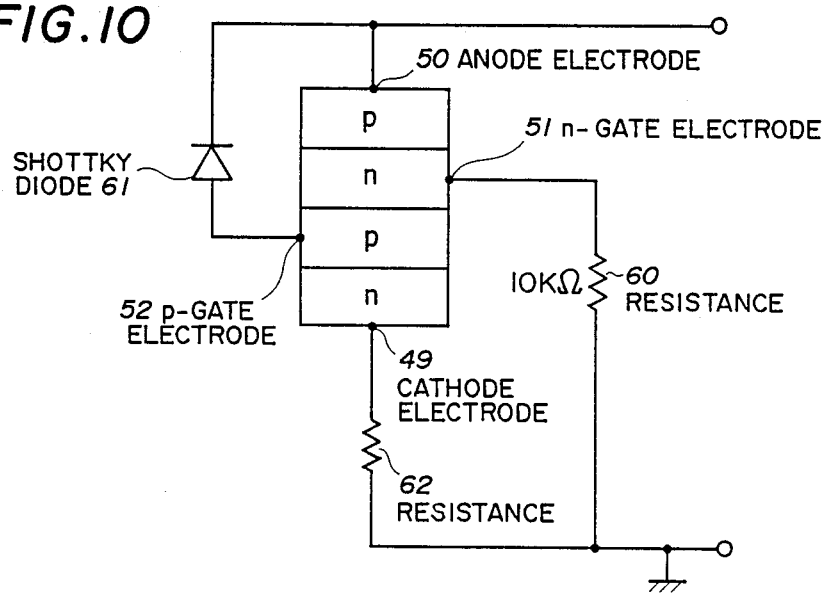

4,864,168

PROCESS FOR CONTROLLING AN OPTICAL PNPN THYRISTOR TO BE DRIVEN

FIELD OF THE INVENTION

The invention relates to a process for controlling an optical pnpn thyristor to be driven, and more particularly to a process for controlling an optical pnpn thyristor to be driven in which the optical pnpn thyristor is turned on to be held with less power consumption.

BACKGROUND OF THE INVENTION

An optical semiconductor memory in which light emission is performed with a small amount of trigger light to be continued even after the extinction of the trigger light is a basic device indispensable with an optical apparatus such as an optical switching, an information parallel processing system etc.

Such an optical semiconductor memory is described as an optical pnpn thyristor on pages 596 to 600 of "Journal of Applied Physics, 59 (2), 15 Jan. 1986". The conventional optical pnpn thyristor comprises an anode layer of p-AlGaAs, a cathode layer of n-AlGaAs, and a gate layer sandwiched between the anode and cathode layers wherein the gate layer is of a forbidden band narrower than those of the anode and cathode layers and includes an n-gate layer of n-GaAs and a p-gate layer of p-GaAs.

In operation, the pnpn thyristor is turned on to be shifted from a high impedance state to a low impedance state wherein carriers are mainly injected into the n-gate layer to be confined therein thereby emitting light with a high light emission efficiency. If a predetermined bias voltage less than a turning-on voltage is applied across the anode and cathode layers, light emission is continued even after the extinction of a trigger light so that the pnpn thyristor can be used for an optical memory.

In the conventional optical pnpn thyristor, however, there is a disadvantage that a considerable amount of electric power is consumed in maintaining the ON state by applying the predetermined voltage thereto under the extinction of the trigger light. According to the report of the aforementioned "Journal of Applied Physics", output light of 30 μW is obtained with an injected current of 100 mA when voltage of approximately 1.5 V is applied across the anode and cathode layers. Therefore, a power consumption of 150 mW is resulted from one element of the pnpn thyristor. As compared to an electronic semiconductor memory such as S-RAM, D-RAM etc. the value of 150 mW is much higher so that it is difficult to put the pnpn thyristor into a practical use due to a construction that pnpn thyristors of the number as much as required must be arranged on a wafer.

SUMMARY OF THE INVENTION

Accordingly, it is an object of the invention to provide a process for controlling an optical pnpn thyristor to be driven wherein ON state is held to store an optical information which is written thereinto and read therefrom with a low electric power consumption.

According to the invention, a process for controlling an optical pnpn thyristor to be driven comprises steps of, shifting an optical pnpn thyristor from a high impedance state to a low impedance state to provide light emission by applying a first positive set pulse across anode and cathode thereof, said optical pnpn thyristor including an anode region of p-semiconductor, a cathode region of n-semiconductor, and a plurality of semiconductor layers sandwiched between said anode and cathode regions, applying a train of pulses across said anode and cathode intermittently, each of said pulses being less in its level than said first positive set pulse so that said low impedance state of said optical pnpn thyristor is held without light emission, and applying a second positive set pulse across said anode and cathode of said optical pnpn thyristor which is held in said low impedance state to provide light emission.

BRIEF DESCRIPTION OF DRAWINGS

The invention will be explained in more detail in conjunction with appended drawings wherein, FIGS. 1A and 1B are cross sectional and top views showing a conventional optical pnpn thyristor, FIG. 4 is a cross sectional view showing an optical pnpn thyristor used for conducting a process for controlling an optical pnpn thyristor to be driven according to the invention, FIGS. 9A to 9D are timing charts showing a relation among voltage, trigger output, current, and output light in the second embodiment, and FIG. 10 is a circuit diagram showing a process for controlling an optical pnpn thyristor to be driven in the first embodiment.

DESCRIPTION OF PREFERRED EMBODIMENTS

Figure 2:
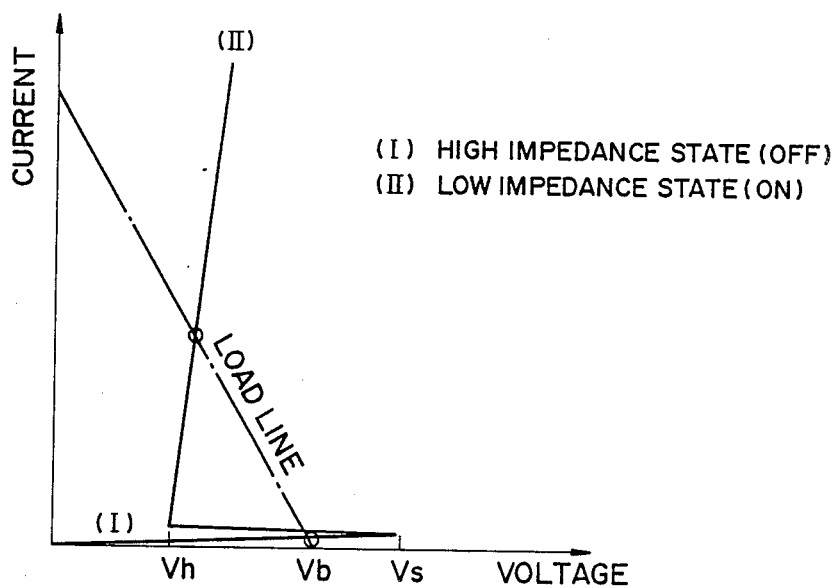
FIG. 2 is a graph showing a relation between voltage and current when the conventional optical pnpn thyristor is driven.
Figure 3A:
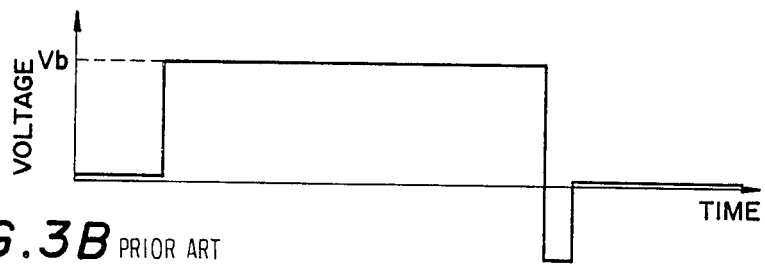
FIGS. 3A to 3C are timing charts showing a relation among voltage, trigger light and light output when the conventional optical pnpn thyristor is driven.
Figure 3B:
Figure 3C:
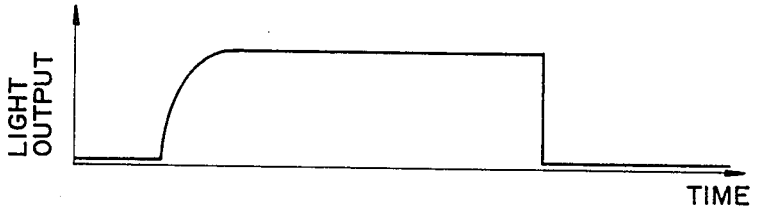

Before describing a process for controlling an optical pnpn thyristor to be driven in an embodiment according to the invention, the aforementioned pnpn thyristor which is described in the "Journal of Applied Physics" will be explained. FIGS. 1A and 1B show the pnpn thyristor which comprises a contact layer 31 of P+-GaAs, a buffer layer 32 of P+-GaAs having a thickness of 0.3 μm, an anode layer 33 of P+-AlGaAs having a thickness of 0.5 μm, an n-gate layer 34 of nGaAs having a thickness of 1 μm, a P+-gate layer 35 of P+-GaAs having a thickness of 30 |, a cathode layer 36 of n-AlGaAs having a thickness of 400 Å, a contact layer 37 of n+-GaAs having a thickness of 0.5 μm, an anode electrode 30 formed on the back surface of the contact layer 31, and a cathode electrode 38 having an aperture 38A for trigger and output lights formed on the top surface of the contact layer 37. In the pnpn thyristor, the n and P+- gate, layers 34 and 35 are sandwiched between the anode and cathode layers 33 and 36, and forbidden band width of the formers are narrower than those of the latters.

In operation, when the pnpn thyristor is turned on, a state thereof is shifted from a high impedance to a low impedance, and carriers are mainly injected into the n-gate layer 34 and confined therein to result in light emission therefrom. As described before, a high light emission efficiency is obtained because the gate layer including the n and P+-gate layers 34 and 35 is sandwiched between the anode and cathode layers 33 and 36 having wider forbidden bands than that of the gate layer.

FIGS. 2 and 3A-3C show a conventional process for controlling such an optical pnpn thyristor to be driven wherein voltage $V_b$ less than a switching voltage $V_s$ by which a high impedance state is shifted to a low impedance state is applied to an optical pnpn thyristor. In the circumstance, the pnpn thyristor is turned on to emit light when trigger light is supplied thereto. As long as the voltage $V_b$ is not less than voltage $V_h$ as shown in FIG. 2 even if the voltage $V_b$ is decreased down to the voltage $V_h$ after the turning-on of the pnpn thyristor, the low impedance state is maintained therein. Thus, the voltage $V_h$ is defined as a holding voltage. In such a low impedance state, light output of 30 $\mu$W is obtained with current of 100 mA when the voltage $V_b$ of 1.5 V which is more than the holding voltage $V_h$ is applied across anode and cathode layers thereof as described before. Therefore, there is the aforementioned disadvantage in the conventional process for controlling an optical pnpn thyristor to be driven.

Figure 5:
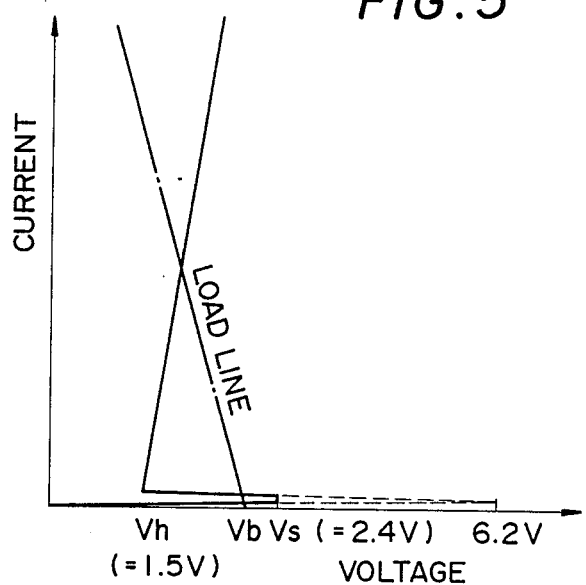
FIG. 5 is a graph showing a relation between voltage and current in a process for controlling an optical pnpn thyristor to be driven in a first embodiment according to the invention.

FIG. 4 shows an optical pnpn thyristor used in an experiment in which a process for controlling an optical pnpn thyristor to be driven according to the invention is embodied as described later. The optical pnpn thyristor comprises a buffer layer 42 of n-GaAs having a thickness of 0.5 $\mu$m and a carrier density of $2 \times 10^{18} cm^{-3}$ on a substrate 41 of n-GaAs, a cathode layer 43 of n-Al$_{0.4}$Ga$_{0.6}$As having a thickness of 1 $\mu$m and a carrier density of $5 \times 10^{17} cm^{-3}$, a p-gate layer 44 of p-GaAs having a thickness of 50 Å and a carrier density of $1 \times 10^{19} cm^{-3}$, an n-gate layer 45 of n-GaAs having a thickness of 1 $\mu$m and a carrier density of $1 \times 10^{17} cm^{-3}$, an anode layer 46 of p-Al$_{0.4}$Ga$_{0.6}$As having a thickness of 0.5 $\mu$m and a carrier density of $5 \times 10^{18} cm^{-3}$, and a contact layer 47 of p-GaAs, respectively grown by using molecular beam epitaxy (MBE). The optical pnpn thyristor further comprises a cathode electrode 49 provided on the back surface of the substrate 41, an anode electrode 50 provided on the top surface of the contact layer 47, an n-gate electrode 51 provided on the n-gate layer 45, and a p-gate electrode 52 provided on a diffusion region 48 diffused through the n-gate layer 45 and the p-gate layer 44 into the cathode layer 43 with $Z_n$. In the pnpn thyristor, a cathode region is composed of the cathode layer 43, the buffer layer 42 and the substrate 41, and an anode region is composed of the contact layer 47 and the anode layer 46. The size of the pnpn thyristor described above is 100 $\mu$m $\times$ 100 $\mu$m, and a switching voltage $V_s$ and a holding voltage $V_h$ are 6.2 V and 1.5 V, respectively as shown in FIG. 5. The holding voltage $V_h$ is detected visually on a display of a curve tracer in accordance with a measured curve of current and voltage. Although a feature of the invention will be described later, the invention is based on a finding that ON state is stored in an optical pnpn thyristor for a minute time even if a bias voltage $V_b$ is decreased less than a holding voltage $V_h$ under ON state of the pnpn thyristor. According to the pnpn thyristor as shown in FIG. 4, light output is improved to be 200 $\mu$W with current of 100 mA in a low impedance state thereof as compared to the conventional pnpn thyristor because a layer structure thereof is improved.

Figure 6A:
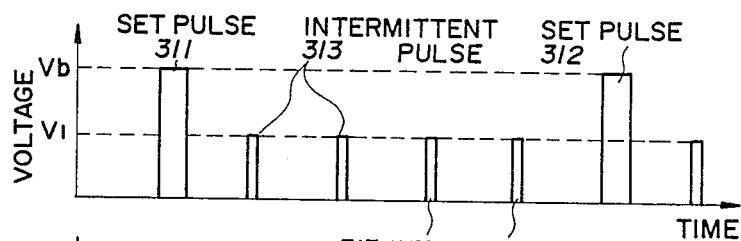
FIGS. 6A to 6D are timing charts showing a relation among voltage, trigger light, current and output light in the first embodiment.
Figure 6B:
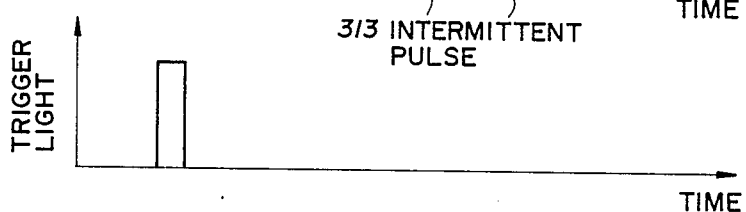
Figure 6C:
Figure 6D:

In operation, a set pulse 311 of voltage $V_b(=2.3$ V$)$ is applied across the anode and cathode electrodes 46 and 43 (FIG. 6A), and trigger light as shown in FIG. 4 by an arrow is supplied to the pnpn thyristor simultaneously (FIG. 6B) so that a state shift is performed therein from a high impedance to a low impedance thereby resulting in current flowing response (FIG. 6C) and light emission (FIG. 6D). Thereafter, the set pulse 311 is turned off, and intermittent pulses 313 each having a pulse width of 500 ns, a pulse interval of 7 $\mu$s and voltage of $V_I(=1.7$ V$)$ are intermittently applied to the anode and cathode electrodes 46 and 43. As a matter of course, the pulse interval is less than a period during which ON state is stored in the pnpn thyristor even if a bias voltage $V_b$ is decreased less than a holding voltage $V_h$. In the circumstance, no current flowing response is observed in a range of illustration in FIG. 6C because the pnpn thyristor operates in a region where a differential resistance for a current and voltage characteristic is very large. In order to maintain ON state of the pnpn thyristor, a small amount of excess carriers must be only held in an exterior of the pnpn thyristor. Therefore, an amount of carriers injected by one of the intermittent pulses 313, that is, current value induced therein is inevitably small. As a result, an electric power consumption of 13 $\mu$W which is a holding electric power is resulted from the application of the intermittent pulse 313. In the embodiment, although the pulse width is 500 ns, it may be shorter than that period during which ON state is held. A holding current is measured to be several $\mu$A in accordance with a current and voltage characteristic of a curve tracer when a holding voltage $V_h$ is 1.5 V. Accordingly, it is considered that a holding electric power can be decreased down to several $\mu$W (several $\mu$A $\times$ 1.5 V) per one element of the pnpn thyristor. As a matter of course, if the size thereof is decreased less than the aforementioned size of 100 $\mu$m $\times$ 100 $\mu$m, the electric power will be proportionally lower. In the above described situation in which ON state is held in the pnpn thyristor by the intermittent pulses 313, a set pulse 312 is applied to the anode and cathode electrodes 46 and 43 thereof without supplying trigger light to the pnpn thyristor (FIGS, 6A and 6B) so that light emission and current flowing response are obtained (FIGS. 6C and 6D). In this case, a current flowing response time is less than 1 ns, while a time during which light output is increased from zero to a normal value is approximately 20 ns. This is a reason why a response time of light output depends on a light emission recombination life of injected carriers.

Here, a feature of the invention will be summarized as follows.

Although an optical pnpn thyristor is turned on to provide light emission by a positive bias voltage applied across an anode and cathode electrodes thereof and trigger light supplied thereto, the light emission is ceased and an information of a fact that light is supplied thereto is erased when the bias voltage is turned off. For this reason, the positive bias voltage is kept to be applied across the anode and cathode electrodes thereof so that the information is stored therein.

Figure 7A:
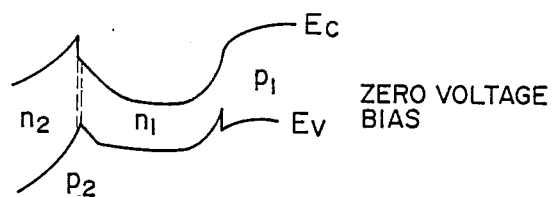
FIGS. 7A to 7C are energy band diagrams of an optical pnpn thyristor.
Figure 7B:
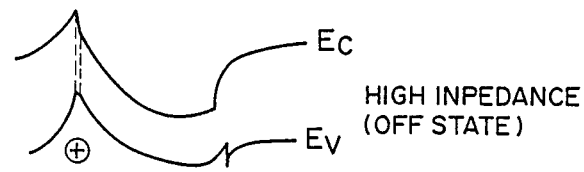
Figure 7C:
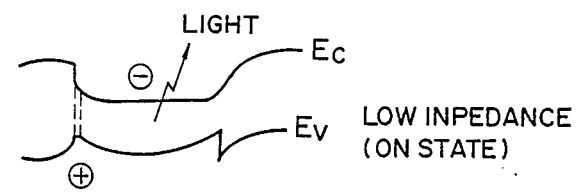

On the other hand, the inventors found in their experiment that ON state is held in a pnpn thyristor for a minute time even if a bias voltage is turned off. In such a pnpn thyristor, it is necessary to expel excess carriers from three forward biased pn junctions thereby restoring a high impedance state from a low impedance state as shown in FIGS. 7A to 7C. Even if a bias voltage is dropped down to zero before completing the restoration of a high impedance state, the low impedance state is held. In the experiment, it is confirmed that a time during which the low impedance state is held under no bias voltage is several hundreds ns to several tens $\mu$s. It is further confirmed that if a train of positive intermittent pulses having a pulse interval less than the aforementioned period are applied across the anode and cathode electrodes to intermittently inject a small amount of carriers which are necessary to maintain the low impedance state, the low impedance state is held. As a result, the process for controlling the pnpn thyristor to be driven as described above provides an extremely less electric power consumption as compared to a conventional one.

Next, a process for controlling an optical pnpn thyristor to be driven in a second embodiment according to the invention will be explained wherein the same pnpn thyristor as shown in FIG. 4 is used.

Figure 8:
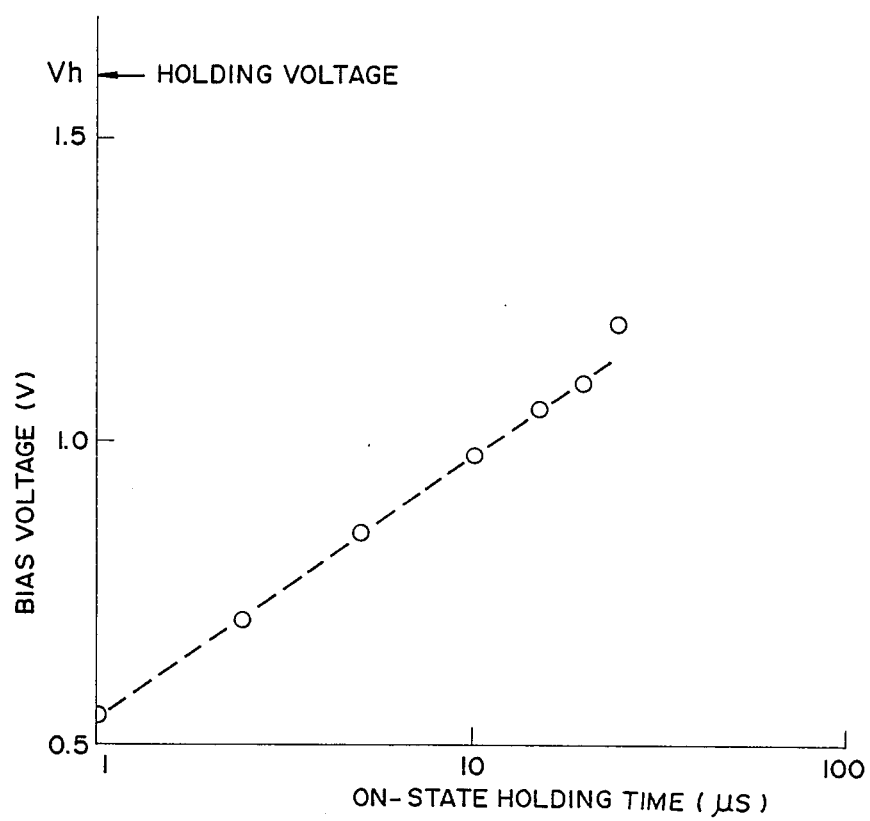
FIG. 8 is a graph showing a relation between ON state holding time and a bias voltage in a process for controlling an optical pnpn thyristor to be driven in a second embodiment according to the invention.

Before describing the second embodiment, it is explained as shown in FIG. 8 that ON state holding time on the horizontal axis is linearly proportional to a bias voltage on the vertical axis which is less than a holding voltage $V_h$. Accordingly, a bias voltage $V_{b1}$ less than a peak value of intermittent pulses 313 is constantly applied, as shown in FIG. 9A, across an anode and cathode electrodes of an optical pnpn thyristor which is turned on to be in a low impedance state by a set pulse 311, which is kept to remain in the low impedance state by the intermittent pulses 313, and which is again turned on to emit light for the reading of information stored therein by a set pulse 312. The ON holding time can be as long as 25 $\mu$s in a case where a bias voltage $V_{b1}(=1.2$ V) is applied so that a repetition frequency of the intermittent pulses 313 can be lowered as clearly understood from the comparison between FIGS. 6A and 9A.

Finally, a high speed turning off (erasing) process of an optical pnpn thyristor will be explained in FIG. 10. For the purpose, it is known that a negative reset pulse is applied across the anode and cathode electrodes of the pnpn thyristor. In FIGS. 4 and 10, the n and p-gate electrodes are provided wherein a resistance 60 of 10k$\Omega$ is connected between the n-gate electrode 51 and the ground, and a Shottky diode 61 (for instance, 15512 M of NEC Corporation) is connected between the anode electrode 50 and the p-gate electrode 52, provided that a resistance 62 connected between the cathode electrode 49 and the ground is a series resistance for adjusting a value of current which flows during ON state of the pnpn thyristor. In the provision of the resistance 60, a switching voltage $V_s$ is decreased from 6.2 V to 2.4 V for the reason why electrons are injected through the resistance 60 into the n-gate layer. A high speed erasing of ON state can be realized in the presence of a bypass for pulling out excess carriers at a time of resetting the pnpn thyristor.

As described above, the invention relates to a process for controlling an optical pnpn thyristor which is applicable to an image processing, an optical logic calculation etc. wherein ON state of the pnpn thyristor is held by applying intermittent pulses with a predetermined pulse interval after an optical information is written into the pnpn thyristor. In the circumstance, a set pulse is applied to the pnpn thyristor only when light emission is required to read the optical information therefrom. As a result, electric power is prevented from being consumed more than necessary in a time storing the optical information so that an optical memory with less electric power consumption can be realized for the first time. In a case where the invention is applied to an optical pnpn thyristor matrix and a process for controlling the pnpn thyristor matrix to be driven, a processing of a stored image data, a pattern discrimination etc. in which an enormous processing time is consumed in a presently used digital computer can be performed with a short processing time.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A process for controlling an optical pnpn thyristor to be driven comprising steps of,
    shifting an optical pnpn thyristor from a high impedance state to a low impedance state to provide light emission by applying a first positive set pulse across anode and cathode thereof, said optical pnpn thyristor including an anode region of p-semiconductor, a cathode region of n-semiconductor, and a plurality of semiconductor layers sandwiched between said anode and cathode regions,
    applying a train of pulses across said anode and cathode intermittently, each of said pulses being less in its level than said first positive set pulse so that said low impedance state of said optical pnpn thyristor is held without light emission, and
    applying a second positive set pulse across said anode and cathode of said optical pnpn thyristor which is held in said low impedance state to provide light emission.

2. A process for controlling an optical pnpn thyristor to be driven according to claim 1 further comprising a step of,
    applying a positive bias voltage less in its level than said train of pulses across said anode and cathode of said optical pnpn thyristor constantly, said optical pnpn thyristor being shifted to be in said low impedance state by said first positive set pulse.

* * * * *

UNITED STATES PATENT AND TRADEMARK OFFICE
CERTIFICATE OF CORRECTION

PATENT NO. : 4,864,168
DATED : September 5, 1989
INVENTOR(S) : Kenichi Kasahara et al It is certified that error appears in the above-identified patent and that said Letters Patent is hereby corrected as shown below:

Column 2, line 64, delete "30 I" and insert --30Å--

Signed and Sealed this

Twenty-fifth Day of December, 1990

Attest:

HARRY F. MANBECK, JR.

*Attesting Officer*  *Commissioner of Patents and Trademarks*